United States Patent
Buckner, III

(10) Patent No.: US 9,949,401 B2
(45) Date of Patent: Apr. 17, 2018

(54) IN-WALL INFORMATION NETWORKING SYSTEM

(71) Applicant: Tommy Joe Buckner, III, Yukon, OK (US)

(72) Inventor: Tommy Joe Buckner, III, Yukon, OK (US)

(*) Notice: Subject to any disclaimer, the term of this patent is extended or adjusted under 35 U.S.C. 154(b) by 0 days.

(21) Appl. No.: 15/595,194

(22) Filed: May 15, 2017

(65) Prior Publication Data

US 2017/0332511 A1   Nov. 16, 2017

Related U.S. Application Data

(60) Provisional application No. 62/337,210, filed on May 16, 2016.

(51) Int. Cl.
| | |
|---|---|
| *H04L 12/28* | (2006.01) |
| *H05K 7/14* | (2006.01) |
| *H05K 7/20* | (2006.01) |
| *H04L 12/10* | (2006.01) |

(52) U.S. Cl.
CPC .......... *H05K 7/1492* (2013.01); *H04L 12/10* (2013.01); *H04L 12/2856* (2013.01); *H04L 12/2898* (2013.01); *H05K 7/20836* (2013.01)

(58) Field of Classification Search
None
See application file for complete search history.

(56) References Cited

U.S. PATENT DOCUMENTS

| | | | | |
|---|---|---|---|---|
| 6,282,683 | B1* | 8/2001 | Dapper | G06F 17/14 |
| | | | | 348/E7.07 |
| 7,209,358 | B2* | 4/2007 | Garnett | G11B 33/126 |
| | | | | 361/735 |
| 7,652,889 | B2* | 1/2010 | Larson | G06F 1/187 |
| | | | | 361/749 |
| 7,663,705 | B2 | 2/2010 | Ryu | |
| 8,745,264 | B1* | 6/2014 | Marr | H04L 67/42 |
| | | | | 709/235 |
| 9,268,730 | B2* | 2/2016 | Stewart | G06F 13/4081 |
| 9,367,243 | B1* | 6/2016 | Hayes | G06F 3/0608 |
| 2004/0000815 | A1* | 1/2004 | Pereira | G06F 1/189 |
| | | | | 307/11 |
| 2009/0189774 | A1* | 7/2009 | Brundridge | H02J 13/001 |
| | | | | 340/654 |
| 2012/0331119 | A1* | 12/2012 | Bose | H04L 61/6004 |
| | | | | 709/223 |
| 2014/0195859 | A1* | 7/2014 | Dickenson | G06F 11/183 |
| | | | | 714/43 |
| 2015/0094968 | A1* | 4/2015 | Jia | G06Q 40/04 |
| | | | | 702/60 |

(Continued)

OTHER PUBLICATIONS amazon.com; "T-Power® (6.6ft Long Cable) for Comcast Xfinity Motorola Surfboard . . . PN# 503913-007 Model: MT-20-21120-A04F AC DC Adapter"; retrieved on May 11, 2016 from http://www.amazon.com.

(Continued)

*Primary Examiner* — Xanthia C Cunningham
(74) *Attorney, Agent, or Firm* — Robert H. Frantz

(57) ABSTRACT

A vent-free, fan-less pre-configured Information Technology component cluster suitable for in-wall mounting is provided which maintains proper operational temperature of all components within the cluster.

8 Claims, 1 Drawing Sheet

(56) References Cited

U.S. PATENT DOCUMENTS

| | | | |
|---|---|---|---|
| 2015/0347600 A1* | 12/2015 | Tabe ................. | G06F 17/30867 707/710 |
| 2016/0127875 A1* | 5/2016 | Zampini, II .......... | H04W 4/043 370/311 |
| 2016/0266632 A1* | 9/2016 | Crawford ........... | H05K 7/20736 |
| 2017/0064875 A1* | 3/2017 | Casey ................ | H05K 7/20736 |

OTHER PUBLICATIONS

Motorola; "SURFboard SB6183 DOCSIS 3.0 Cable Modem—User Guide"; Copyright 2014.
Leviton; "Series 280 & 420 Structured Media Enclosures", retrieved from http://www.leviton-lin.com; copyright 2004.
amazon.com; "Partaker Commercial Office Intel Quad Core 15 Fanless Mini PC Wifi Linux HDMI VGA 8G RAM 1TB HDD"; retrieved on May 11, 2016 from http://www.amazon.com.
amazon.com; "AC Adapter Power Supply for Motorola SB6121 SB6120 12V/.75A 750mA 90-240v Input"; retrieved on May 11, 2016 from http://www.amazon.com.

\* cited by examiner

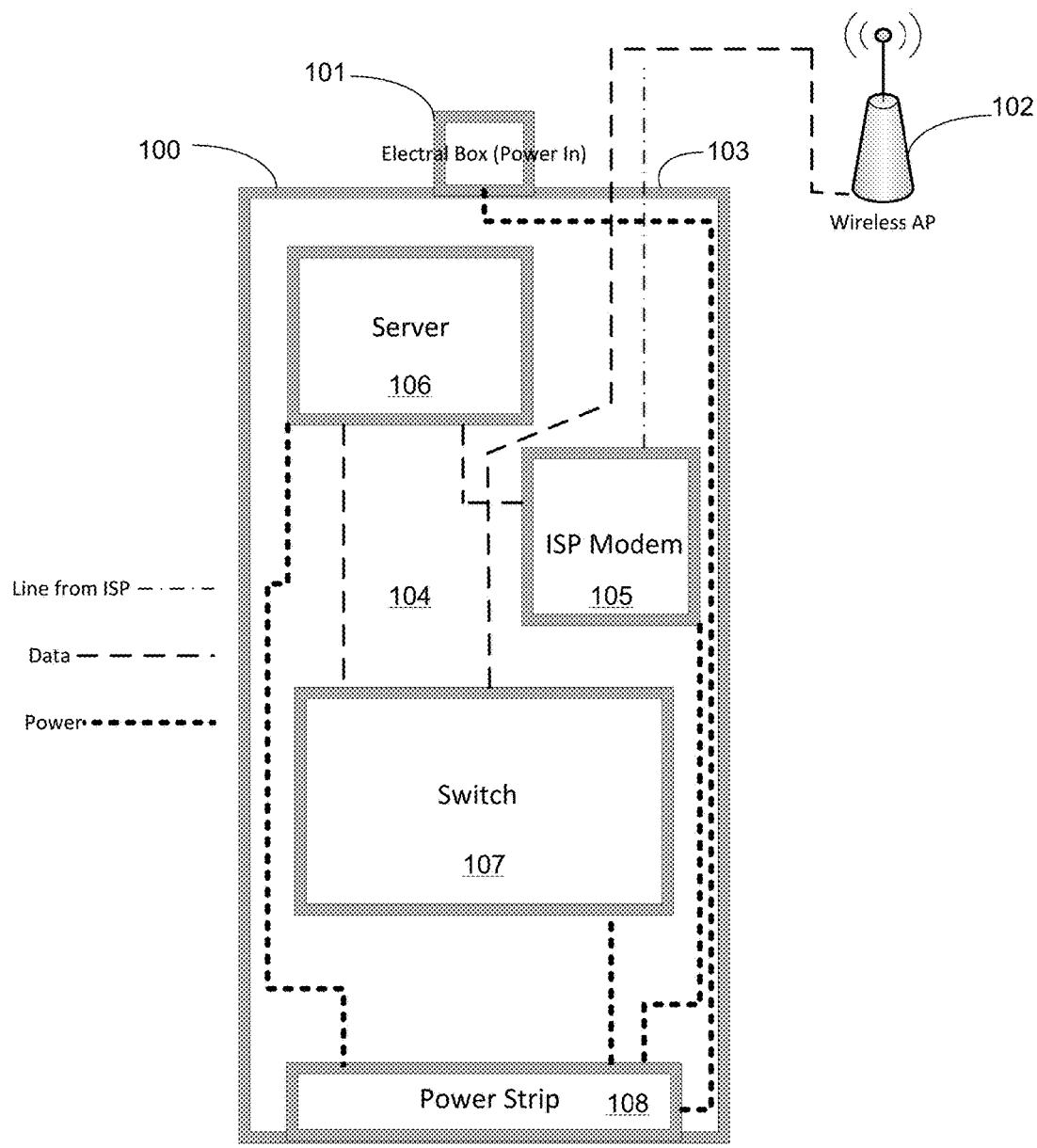

IN-WALL INFORMATION NETWORKING SYSTEM

FIELD OF THE INVENTION

This application claims benefit of the filing date of U.S. Provisional Patent Application 62/337,210, our docket FGPTJB2016P1, filed on May 16, 2016, by Tommy J. Buckner III. This invention relates to home, small-business and non-profit networking systems which can be pre-configured and readily installed in a flush-mount (in-wall) arrangement without requiring heat dissipation via ventilation.

BACKGROUND OF INVENTION

Large business entities have the staff with expertise and the budget to configure several racks of components in their networking centers that provide for a broad variety of functions, including firewalls, remote maintenance servers, routers, and the like. While many homes, small-businesses, and non-profit organizations now have as many connected devices within their enterprise as large corporations had just ten years ago, the level of expertise and budget needed to replicate these functions has not proliferated to these smaller entities.

SUMMARY OF THE INVENTION

A vent-free, fan-less pre-configured Information Technology component cluster suitable for in-wall mounting is provided which maintains proper operational temperature of all components within the cluster.

BRIEF DESCRIPTION OF THE DRAWINGS

The figures presented herein, when considered in light of this description, form a complete disclosure of one or more embodiments of the invention, wherein like reference numbers in the figures represent similar or same elements or steps.

FIG. 1 provides a block diagram of a pre-configured cluster in an in-wall cabinet according to the present invention.

DETAILED DESCRIPTION OF EMBODIMENT(S) OF THE INVENTION

The present inventor has recognized an unmet need in the art for a solution which mirrors the functionality of large enterprises but requires less expertise and budget to achieve in networking for small businesses, homes, and non-profit organizations.

A pre-configured cluster of networking systems and appliances in a single package allows such a small entity to purchase and quickly install these functions with little or no knowledge of the components contained therein. And, by including in the cluster a remote maintenance server, the user or installer may obtain remote support for further tailoring of the configuration or troubleshooting without having to open the "black box" solution.

One particular problem that arise in small entities more often than larger entities is that of dedicated space where these components are installed in and operated. While a larger entity may dedicate entire rooms with special cooling to their information technology (IT) infrastructure, smaller entities such as churches, boutique law firms, insurance agents, doctors' offices, investment advisors, etc., and even private homes, condominiums and apartments may not be able to dedicate an entire room with forced cooling into the room.

Because many small entities rent or lease their space, they are not as free to make changes to the air conditioning, and in some cases, may not even be in control of their thermostats. Many small entities attempt to place their IT infrastructure systems into a closet, where heat build-up may cause some of the systems to slow their clock speeds, and thus reduce their performance, and may lead to early failure of some components.

The present inventor has recognized this context challenge which is not mirrored in the context of larger entities, and realized that a flush-mount, in-wall solution requires no additional floor or rack space. An in-wall cabinet containing an complete pre-configured IT infrastructure cluster of components would provide the small entity with the packaged solution they need without requiring dedication of valuable room or floor space.

However, a significant challenge to providing this pre-configured in-wall cluster-in-a-box is heat dissipation. Within residential and many office walls is a gap defined by two sheets of wall board, typically gypsum board, and at least two vertical studs, wooden or steel. So, ventilation towards the side of the box (towards the studs) is not an option. And, ventilation within the gap towards the top or bottom of the box is also not an option because in some installations, these gaps are blocked by fire-break horizontal studs, by insulation, or other obstructions. Further, the quality of the air available within this gap is unknown because it is not filtered air like that within the living space of the room itself.

Another option would be to use fans to pull air into the cabinet from the room, such as from the bottom area of an access door, blow it upwards in the cabinet, and out the top of the access door back into the room. This air flow would be similar to that of a window-unit air conditioner. However, in some installations, such as in a closet in a home, the air in the room may not circulate well enough to dissipate the heat of the components, and eventually the same overheating problem occurs.

The present inventor has realized that a ventilation-free solution meets the unsatisfied need, and has set about determining one or more configurations which can reliably operate within ordinary size in-wall cabinets using experimental methods and verification through temperature rise measurements.

In one exemplary embodiment, the present inventor pre-configured an in-wall IT infrastructure cluster (100) into an in-wall, flush-mount utility cabinet (100). The interior space (104) was pre-configured with a fanless web server component (106) for remote maintenance and monitoring functions, a cable/broadband modem (105), a data switch (107), and a surge-suppressing power strip (108), as shown in FIG. 1. Viewed as a ready-to-use, pre-configured "black box" solution for small entities, the system (100) has only external connections for mains power (e.g., 120V AC) (101), and data connections to an internet service provider (ISP) (103) and external wireless access point (102).

For this prototype, the present inventor used a Leviton Integrated Networks™ model 47605-28W Series 280M Structured Media™ Center for the cabinet (100). An Inctel™ Partaker Fanless PC running the Untangle™ NG Firewall as a virtual machine (and optionally an ESXI™ Free VMWare server suite) was used for the web server (106). A Cisco™ SG300-10MPP was configured for the data switch (107). A Motorola™ Arris Surfboard™ was used for the ISP-compatible modems. The choice of surge suppressor power strips is believed to be inconsequential to the heat build-up in the unventilated interior. The components were affixed to the back wall of the cabinet using industrial strength hook-and-loop fastener strips which facilitates tool-free installation, relocation, and removal.

The interior dimensions of this particular cabinet provide approximately 1,450 cubic inches of air space. The major power dissipations, disregarding the minor power dissipation of the AC/DC adapters and the power strip itself, are the remote maintenance server PC (45W maximum), the ISP modem (12 VDC*750 mA=9W maximum). Thus, the total power dissipated within the vent-free cabinet is approximately 54W, for a power density of 37 mW per cubic inch (37 mW/in$^3$). In this experimental configuration, temperatures of the components stabilized at 98 degrees Fahrenheit during realistic operational demands (e.g., data actively streaming and maintenance operations being remotely performed) well within the operational specifications for each component with the cabinet installed in a wall and a door or lid fully affixed.

As a result, we have reached the conclusion that other sizes of vent-free, fanless in-wall cabinets may be utilized with other combinations of IT infrastructure components so long as a power density budget of approximately 50 mW/in$^3$ is not exceeded relative to the interior volume of the cabinet.

This embodiment of a prototype according to the present invention was developed to bring more protection and features to the average end-user at the home, small business, and non-profit entity level with minimal heat and low power consumption, and with ultra-convenient installation requiring no IT expertise and consuming no room floor space. Embodiments according to the present invention are useful for "new build" construction as well as retrofit installations where no data drops or data protection functions are already in place. For installation situations where some amount of data wiring is already in place, the pre-configured in-wall IT cluster adds accommodation for networking equipment components which are highly recommended for modern security and reliability (e.g., firewall devices, router/switches, etc.). Additionally, use of an embodiment of the present invention solves the clutter and hazards that wires out in the open present to animals or humans (e.g., strangulation, trip, etc.).

CONCLUSION

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof, unless specifically stated otherwise.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It should also be recognized by those skilled in the art that certain embodiments utilizing a microprocessor executing a logical process may also be realized through customized electronic circuitry performing the same logical process(es).

It will be readily recognized by those skilled in the art that the foregoing example embodiments do not define the extent or scope of the present invention, but instead are provided as illustrations of how to make and use at least one embodiment of the invention. The following claims define the extent and scope of at least one invention disclosed herein.

The invention claimed is:

1. An in-wall pre-configured information technology component cluster comprising:
    a cabinet providing an unvented enclosure around a closed interior volume, with external electronic interconnects for power mains, data services, and an external wireless networking access point;
    a power distribution unit disposed in the closed interior volume electrically connected to the power mains external interconnect; and
    a cluster of electronic components disposed in the closed interior volume, receiving power from the power distribution unit and interfaced to one or more of the external electronic interconnects, comprising:
        a remote maintenance server; and
        an internet service provider modem;
    wherein a total power density of the power distribution unit plus the cluster does not exceed a pre-determined maximum power density within the closed volume; and
    wherein exterior dimensions of the cabinet conform to width, height, and depth for installation within a hollow-construction wall between two vertical studs.

2. The in-wall pre-configured information technology component cluster as set forth in claim 1 wherein the pre-determined maximum power density is 50 milliwatts per cubic inch.

3. The in-wall pre-configured information technology component cluster as set forth in claim 1 wherein the power distribution unit comprises a surge-protected power strip.

4. The in-wall pre-configured information technology component cluster as set forth in claim 1 wherein the closed volume is 1450 cubic inches.

5. A method of manufacture of an in-wall pre-configured information technology component cluster comprising:
    disposing a power distribution unit disposed in a closed interior volume of a cabinet, wherein the cabinet provides an unvented enclosure around the closed interior volume, the cabinet having external electronic interconnects for power mains, data services, and an external wireless networking access point, wherein exterior dimensions of the cabinet conform to width, height, and depth for installation within a hollow-construction wall between two vertical studs;
    connecting the power distribution unit to the power mains external interconnect;

disposing a cluster of electronic components in the closed interior volume, the cluster comprising at least a remote maintenance server and an internet service provider modem;

connecting the internet service provider modem to the power distribution unit, and to the data services external electronic interconnect; and connecting the remote maintenance server to the power distribution unit and to the internet service provider modem;

wherein a total power density of the power distribution unit plus the cluster does not exceed a pre-determined maximum power density within the closed volume.

6. The method of manufacture as set forth in claim 5 wherein the pre-determined maximum power density is 50 milliwatts per cubic inch.

7. The method of manufacture as set forth in claim 5 wherein the power distribution unit comprises a surge-protected power strip.

8. The method of manufacture as set forth in claim 1 wherein the closed volume is 1450 cubic inches.

* * * * *